United States Patent
Iwasaki

(10) Patent No.: US 10,797,481 B2
(45) Date of Patent: Oct. 6, 2020

(54) REVERSE CONNECTION PROTECTION CIRCUIT AND LOAD SYSTEM

(71) Applicant: DENSO CORPORATION, Kariya, Aichi-pref. (JP)

(72) Inventor: Hirosuke Iwasaki, Kariya (JP)

(73) Assignee: DENSO CORPORATION, Kariya, Aichi-Pref. (JP)

( * ) Notice: Subject to any disclaimer, the term of this patent is extended or adjusted under 35 U.S.C. 154(b) by 414 days.

(21) Appl. No.: 15/901,266

(22) Filed: Feb. 21, 2018

(65) Prior Publication Data
US 2018/0248355 A1    Aug. 30, 2018

(30) Foreign Application Priority Data

Feb. 27, 2017  (JP) .................................. 2017-035285
Sep. 26, 2017  (JP) .................................. 2017-185163
Oct. 13, 2017  (JP) .................................. 2017-199595

(51) Int. Cl.
| H02H 3/18 | (2006.01) |
| H03K 17/687 | (2006.01) |
| H02H 1/00 | (2006.01) |
| H02H 11/00 | (2006.01) |
| H03K 17/082 | (2006.01) |

(52) U.S. Cl.
CPC ............ *H02H 3/18* (2013.01); *H02H 1/0007* (2013.01); *H02H 11/003* (2013.01); *H03K 17/0822* (2013.01); *H03K 17/687* (2013.01)

(58) Field of Classification Search
CPC ...... H02H 3/18; H02H 11/003; H02H 1/0007; H03K 17/0822; H03K 17/687

USPC .......................................................... 361/84
See application file for complete search history.

(56) References Cited

U.S. PATENT DOCUMENTS

| 5,012,381 A * | 4/1991 | Elliott .................. H02H 7/0833 |
| | | 320/165 |
| 5,517,379 A * | 5/1996 | Williams ............. H02H 11/003 |
| | | 307/127 |
| 6,922,322 B2 * | 7/2005 | Strayer .................... H02H 9/04 |
| | | 361/111 |

(Continued)

FOREIGN PATENT DOCUMENTS

| JP | 2012-065405 | 3/2012 |
| JP | 2015-171305 | 9/2015 |
| JP | 2017-020798 | 1/2017 |

*Primary Examiner* — Dharti H Patel
(74) *Attorney, Agent, or Firm* — Maschoff Brennan

(57) ABSTRACT

In a reverse connection protection circuit, a protection element enters a conductive state when the power source is electrically connected in a forward direction to a load-side circuit and enters a non-conductive state when the power source is electrically connected in a reverse direction to the load-side circuit. The protection element has a first terminal electrically connected to a power source-side terminal of, and a second terminal electrically connected to a load-side terminal of the switching element. A booster circuit is electrically connected to the load-side terminal to supply a boosted voltage of more than a power source voltage to the load-side terminal. A voltage detection part is connected to the load-side terminal to detect an output voltage of the switching element. A judgment part is connected to the voltage detection part to detect a switching element failure based of the voltage detected by the voltage detection part.

18 Claims, 6 Drawing Sheets

(56) References Cited

U.S. PATENT DOCUMENTS

| | | | | |
|---|---|---|---|---|
| 6,963,183 B1* | 11/2005 | Kessler | ................ | H02H 7/0833 |
| | | | | 318/434 |
| 9,573,540 B2* | 2/2017 | Kanzaki | ................ | B60R 16/033 |
| 2014/0257632 A1* | 9/2014 | Kanzaki | ................ | B60R 16/033 |
| | | | | 701/36 |
| 2015/0109706 A1* | 4/2015 | Iwamizu | ................ | H02H 9/025 |
| | | | | 361/84 |

* cited by examiner

REVERSE CONNECTION PROTECTION CIRCUIT AND LOAD SYSTEM

CROSS-REFERENCE TO RELATED APPLICATION

This application is related to and claims priority from Japanese Patent Applications No. 2017-035285 filed on Feb. 27, 2017, No. 2017-185163 filed on Sep. 26, 2017, and No. 2017-199595 filed on Oct. 13, 2017, the contents of which are hereby incorporated by reference.

BACKGROUND OF THE INVENTION

1. Field of the Invention

The present invention relates to reverse connection protection circuits and load systems equipped with the reverse connection protection circuit.

2. Description of the Related Art

Patent document 1, Japanese patent laid open publication No. 2015-171305, discloses a power supply circuit composed of an electrical path switching field effect transistor (i.e. the electrical path opening/closing FET), a reverse connection protection FET, a voltage detection circuit, and a control circuit. One terminal of the electrical path opening/closing FET is electrically connected to a positive-electrode terminal of a battery, and the other terminal of the electrical path opening/closing FET is electrically connected to one terminal of the reverse connection protection FET. The other terminal of the reverse connection protection FET is electrically connected to one terminal of a motor drive circuit. The voltage detection circuit detects a voltage at the one terminal of the reverse connection protection FET. The control circuit generates and transmits a turning-on control signal to the reverse connection protection FET, and receives a detection signal transmitted from the voltage detection circuit. The control circuit detects an occurrence of abnormality of the reverse connection protection FET on the basis of the received voltage detection signal.

Because the power supply circuit disclosed in patent document 1 has the electrical path opening/closing FET in addition to the reverse connection protection FET, this structure increases an overall circuit area, and a manufacturing cost thereof.

SUMMARY

It is therefore desired to provide a reverse connection protection circuit having a simple structure and a load system equipped with the reverse connection protection circuit.

In accordance with one aspect of the present invention, there is provided a reverse connection protection circuit configured to protect a load-side circuit during a reverse connection of a power source to a load-side circuit, the load-side circuit comprising an electric load and a load drive circuit. The reverse connection protection circuit has a switching element, a protection element, a boosted voltage supply part, a voltage detection part and a judgment part. The switching element has a power source-side terminal, a load-side terminal and a control terminal. The power source-side terminal of the switching element is electrically connected to the power source. The load-side terminal of the switching element is electrically connected to the load drive circuit. Conduction between the power source-side terminal and the load-side terminal is controlled by the control terminal of the switching element. The protection element is configured to enter a conductive state when the power source is electrically connected in a forward direction to the load-side circuit. Further, the protection element is configured to enter a non-conductive state when the power source is electrically connected in a reverse direction to the load-side circuit. The protection element has a first terminal and a second terminal. The first terminal of the protection element is electrically connected to the power source-side terminal of the switching element. The second terminal of the protection element is electrically connected to the load-side terminal of the switching element. The boosted voltage supply part is electrically connected to the load-side terminal of the switching element so as to supply a boosted voltage to the load-side terminal of the switching element. The boosted voltage is higher than a power source voltage supplied from the power source. The voltage detection part is electrically connected to the load-side terminal of the switching element so as to detect an output voltage at the load-side terminal of the switching element. The judgment part is electrically connected to the voltage detection part so as to detect an occurrence of a switching element failure on the basis of the output voltage detected by the voltage detection part.

The reverse connection protection circuit having the improved structure previously described detects an occurrence of failure of the switching element on the basis of a voltage variation between the battery voltage of the power source and the boosted voltage. This voltage variation between the battery voltage of the power source and the boosted voltage is larger than that caused in a conventional technique. Accordingly, the improved structure of the reverse connection protection circuit according to the present invention makes it possible to correctly detect an occurrence of failure of the switching element without using any electrical path opening/closing FET, with high accuracy.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
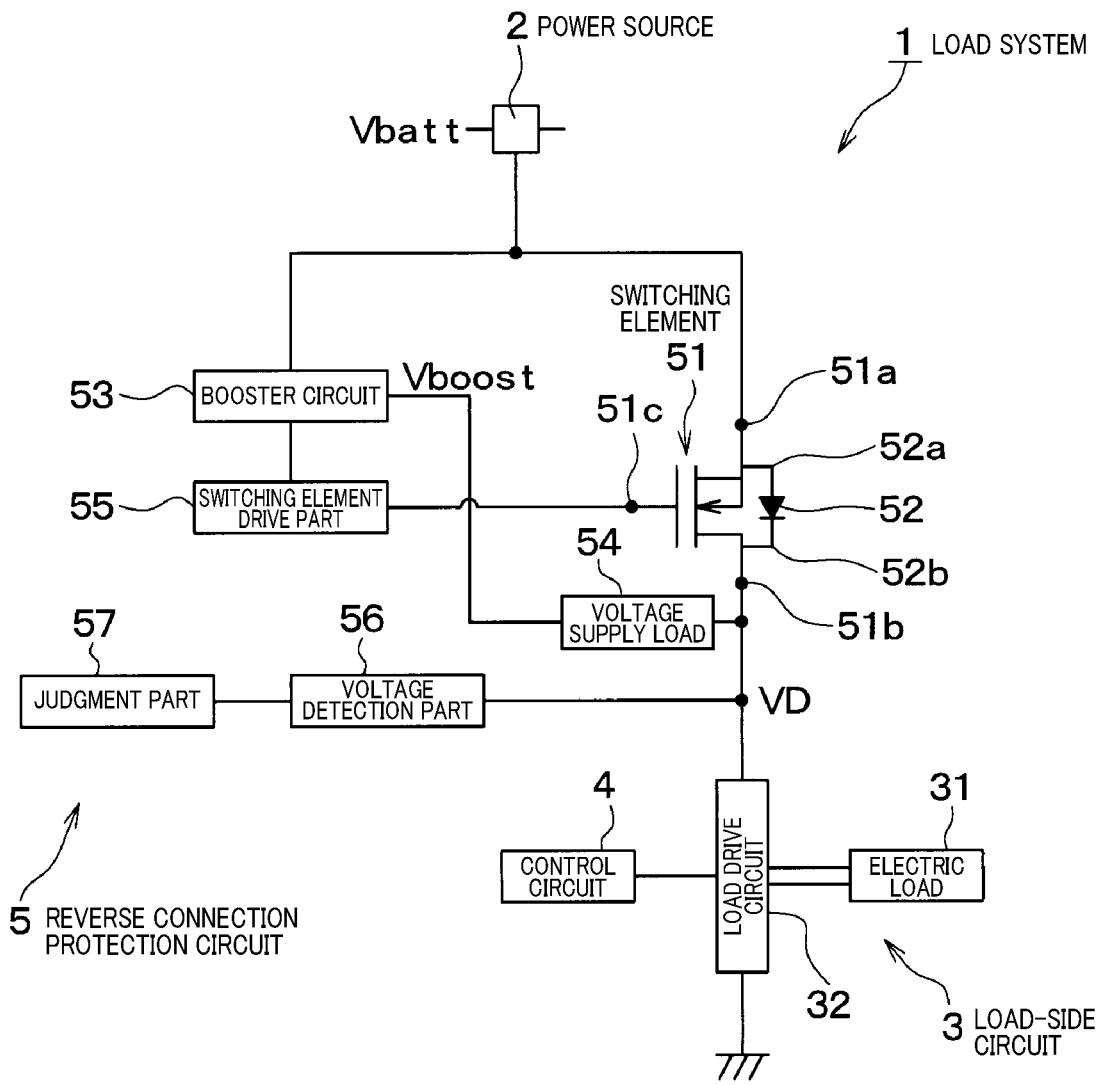
FIG. 1 is a view showing a schematic circuit structure of a load system having a reverse connection protection circuit according to an exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

Exemplary Embodiment

A description will be given of a reverse connection protection circuit 5 according to an exemplary embodiment and first to fifth modifications of the exemplary embodiment with reference to FIG. 1 to FIG. 7.

FIG. 1 is a view showing a load system 1 having a schematic circuit structure of the reverse connection protection circuit 5 according to the exemplary embodiment. As shown in FIG. 1, the load system 1 has a power source 2, a load-side circuit 3, a control circuit 4 and the reverse connection protection circuit 5. The power source 2 is a battery for supplying a direct current voltage. The load system 1 receives the direct current voltage and drives an electric load 31. The load system 1 equipped with the reverse connection protection circuit 5 according to the exemplary embodiment is an electric parking brake system mounted on a vehicle. The electric parking brake system as the load system 1 generates a brake pad pressing force on the basis of a rotary motion of the electric load 31 as an electric motor.

The power source 2 is a battery mounted on the vehicle, and has a high voltage-side terminal (i.e. a positive-electrode terminal) and a low voltage-side terminal (i.e. a negative-electrode terminal). In a forward direction state, the high voltage-side terminal of the power source 2 is electrically connected to the load-side circuit 3 through the reverse connection protection circuit 5 according to the exemplary embodiment. On the other hand, the low voltage-side terminal of the power source 2 is grounded. Hereinafter, an output voltage of the power source 2, i.e. a voltage potential difference between the high voltage-side terminal and the low voltage-side terminal of the power source 2 will be referred as the "battery voltage Vbatt".

The load-side circuit 3 has the electric load 31 and a load drive circuit 32. The electric load 31 is electrically connected to the load drive circuit 32 so that the load drive circuit 32 drives the electric load 31. That is, the load drive circuit 32 is arranged in an electrical path between the power source 2 and the electric load 31.

The load drive circuit 32 is a bridge circuit which has been widely known. The load drive circuit 32 has a plurality of power switching elements, for example, power field effect transistors (or power FETs) or insulated gate bipolar transistors (IGBTs). The load drive circuit 32 receives control signals transmitted from the control circuit 4, and turns on and off each of the power switching elements on the basis of the received control signals so as to drive the electric load 31. The control circuit 4 is electrically connected to the load drive circuit 32 so as to transmit the control signals to the load drive circuit 32.

(Structure of Reverse Connection Protection Circuit)

The reverse connection protection circuit 5 according to the exemplary embodiment is arranged on the power supply path from the power source 2 to the electric load 31. The reverse connection protection circuit 5 is configured to protect the load-side circuit 3 when the power source 2 is electrically connected in reverse to the load-side circuit 3.

A description will now be given of a detailed structure of the reverse connection protection circuit 5.

As shown in FIG. 1, a switching element 51 is arranged on the power supply path between the high voltage-side terminal of the power source 2 and the load drive circuit 32. The switching element 51 has a power source-side terminal 51a, a load-side terminal 51b and a control terminal 51c.

The power source-side terminal 51a is electrically connected to the high voltage-side terminal of the power source 2. The load-side terminal 51b is electrically connected to the load drive circuit 32. The control terminal 51c receives a control signal so as to adjust the conductive state between the power source-side terminal 51a and the load-side terminal 51b. That is, when receiving a turning-on voltage through the control terminal 51c, the switching element 51 generates the electrical connection between the power source-side terminal 51a and the load-side terminal 51b. In the structure of the load system 1 shown in FIG. 1 having the reverse connection protection circuit 5 according to the exemplary embodiment, the switching element 51 is an N channel metal oxide semiconductor field effect transistor (an N channel MOS FET), the power source-side terminal 51a of the switching element 51 is a source terminal of the N channel MOS FET, and the control terminal 51c is a gate terminal of the N channel MOS FET.

The switching element 51 and a protection element 52 are arranged between the high voltage-side terminal of the power source 2 and the load drive circuit 32. The protection element 52 is made of a diode having an anode 52a and a cathode 52b. The anode 52a of the protection element 52 is an upstream-side terminal in a rectifying direction through which the current is rectified. The anode 52a of the protection element 52 is electrically connected to the power source-side terminal 51a of the switching element 51. The cathode 52b of the protection element 52 is a downstream-side terminal in the rectifying direction and electrically connected to the load-side terminal 51b of the switching element 51. That is, the protection element 52 allows the current to flow when the power source 2 is electrically connected in the forward direction, and prohibits the current from flowing when the power source 2 is in the reverse connection.

In the structure of the load system 1 having the reverse connection protection circuit 5 according to the exemplary embodiment, the protection element 52 is made of a parasitic diode of the switching element 51 as an N channel MOS FET. In other words, the switching element 51 and the protection element 52 form the N channel MOS FET.

In addition to the switching element 51 and the protection element 52, the reverse connection protection circuit 5 further has a booster circuit 53, a voltage supply load 54, a switching element drive part 55, a voltage detection part 56 and a judgment part 57.

As shown in FIG. 1, the booster circuit 53 boosts a battery voltage Vbatt as the direct current voltage supplied from the battery, i.e. the power source 2, and supplies a boosted voltage Vboost, which is higher than the battery voltage Vbatt to the load-side terminal 51b of the switching element 51 and the switching element drive part 55. The supply of the boosted voltage Vboost to the load-side terminal 51b of the switching element 51 indicates to supply a voltage potential between the load-side terminal 51b of the switching element 51 and the ground.

Specifically, in the reverse connection protection circuit according to the exemplary embodiment, the booster circuit 53 generates the boosted voltage Vboost immediately when an input-side terminal of the booster circuit 53 is electrically connected to the high voltage-side terminal of the power source 2. An output-side terminal of the booster circuit 53 is electrically connected to the load-side terminal 51b of the switching element 51 through the voltage supply load 54. The voltage supply load 54 is configured to pull up, i.e. increases the voltage at the load-side terminal 51b to the boosted voltage Vboost when the switching element 52 is turned off. Specifically, it is possible to use a resistance element, etc. as the voltage supply load 54. The output-side terminal of the booster circuit 53 is electrically connected to the switching element drive part 55.

The switching element drive part 55 is electrically connected to the control terminal 51c of the switching element 51 and supplies the boosted voltage Vboost as a turning-on voltage to the control terminal 51c in order to allow conduction between the power source-side terminal 51a and the load-side terminal 51b of the switching element 51.

The voltage detection part 56 and the judgment part 57 are formed on a single integrated circuit (IC). The voltage detection part 56 is electrically connected to the load-side terminal 51b of the switching element 51 so as to generate an output signal which corresponds to a downstream-side voltage VD.

The judgment part 57 is electrically connected to the voltage detection part 56 so as to judge an occurrence of abnormality of the reverse connection protection circuit 5 on the basis of the output signal, which corresponds to the downstream-side voltage VD, transmitted from the voltage detection part 56. The abnormality of the reverse connection protection circuit 5 may be a switching element failure and/or voltage-drop abnormality of the boosted voltage Vboost supplied from the booster circuit 53.

As previously described, the reverse connection protection circuit 5 according to the exemplary embodiment has the structure in which the switching element 51 is arranged between the power source 2 and the load drive circuit 32 without using any electrical path closing/opening element. That is, no electrical path closing/opening element is arranged between the power source 2 and the load drive circuit 32. For example, such an electrical path closing/opening element is a transistor element, a relay, etc., so as to open and close the power supply path through which the power source 2 supplies electric power to the electric load 31.

(Effects)

A description will be given of the action and effects of the reverse connection protection circuit 5 having the improved structure previously described according to the exemplary embodiment with reference to FIG. 1 and FIG. 2.

As shown in FIG. 1, the reverse connection protection circuit 5 is electrically connected in series to the power source 2.

Figure 2:
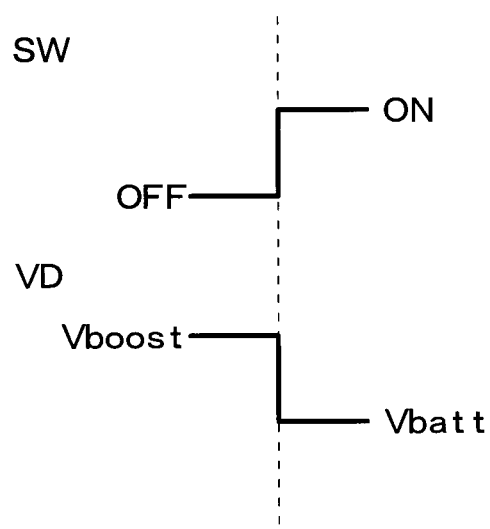
FIG. 2 is a view showing a timing chart of an action of the reverse connection protection circuit according to the exemplary embodiment shown in FIG. 1.

FIG. 2 is a view showing a timing chart of the action of the reverse connection protection circuit 5 according to the exemplary embodiment shown in FIG. 1. In the timing chart shown in FIG. 2, reference character "SW" represents a turned-on state and a turned-off state of the switching element 51. Reference character "ON" indicates a turned-on voltage is supplied to the control terminal 51c of the switching element 51. Reference character "OFF" indicates that the control terminal 51c does not receive the turned-on voltage.

A description will now be given of the action of the switching element 51 when the switching element 51 is normally operating.

Under a situation in which the switching element 51 is turned off, i.e. no turned-on voltage is supplied to the control terminal 51c of the switching element 51, reverse bias is supplied to the protection element 52, and the drain voltage of the load-side terminal 51b of the switching element 51 is boosted to the boosted voltage Vboost. When the switching element 51 is turned on, i.e. the turned-on voltage is supplied to the control terminal 51c of the switching element 51, the power source-side terminal 51a is conducted with the load-side terminal 51b of the switching element 51, and the drain voltage of the load-side terminal 51b of the switching element 51 becomes the battery voltage Vbatt.

On the other hand, when an open circuit failure occurs in the switching element 51, the drain voltage of the load-side terminal 51b of the switching element 51 is maintained at the boosted voltage Vboost. That is, no voltage drop, from the boosted voltage Vboost to the battery voltage Vbatt, occurs at the drain voltage of the load-side terminal 51b of the switching element 51.

On the other hand, when a short-circuit failure occurs in the switching element 51, the drain voltage of the load-side terminal 51b of the switching element 51 becomes the battery voltage Vbatt before the control terminal 51c of the switching element 51 receives the turned-on voltage.

In the structure of the load system 1 having the reverse connection protection circuit 5 according to the exemplary embodiment as previously described, the voltage detection part 56 detects a voltage of the load-side terminal 51b, i.e. a voltage difference between the load-side terminal 51b and the ground. Further, the judgment part 57 judges whether the failure occurs in the switching element 51 on the basis of the detection result of the voltage of the load-side terminal 51b detected by the voltage detection part 56

The structure of the power supply circuit disclosed in the patent document 1 as a conventional technique requires the electrical path opening/closing FET in addition to the reverse connection protection FET so as to judge whether a failure of the reverse connection protection FET occurs.

On the other hand, the reverse connection protection circuit 5 according to the exemplary embodiment having the improved structure previously described correctly detects whether a failure of the switching element 51 occurs without using the electrical path opening/closing FET. The improved structure of the reverse connection protection circuit 5 is capable of correctly detecting an occurrence of abnormality of the switching element 51 and reducing the overall circuit area of the reverse connection protection circuit 5.

For example, there is a conventional technique, Japanese patent laid open publication No. 2012-065405 which detects a failure of a reverse connection protection FET without using an electrical path opening/closing FET. Because the conventional technique detects a voltage variation between the drain and source of the reverse connection protection FET within a narrow voltage range of 0.7 volt to 1.4 volt, the conventional technique is required to correctly detect an occurrence of failure of the reverse connection protection FET with a high detection accuracy.

On the other hand, the reverse connection protection circuit 5 according to the exemplary embodiment having the improved structure detects an occurrence of failure of the switching element 51 on the basis of a voltage variation between the battery voltage Vbatt and the boosted voltage Vboost. The voltage variation between the battery voltage Vbatt and the boosted voltage Vboost is larger than that of the conventional technique. Accordingly, the reverse connection protection circuit 5 according to the exemplary embodiment makes it possible to correctly detect the occurrence of failure of the switching element 51 without using a highly accurate electrical path opening/closing FET when compared with the conventional techniques previously described.

In the structure of the reverse connection protection circuit 5 according to the exemplary embodiment as previously described, the switching element 51 composed of the N-channel MOS FET is arranged at a high voltage side of the load drive circuit 32. Accordingly, in order to drive the switching element 51, it is necessary to use the boosted voltage Vboost which is higher than the power source-side terminal 51a as the source terminal of the switching element 51 electrically connected to the power source 2.

In the structure of the load system 1 having the reverse connection protection circuit 5 according to the exemplary embodiment as previously described, the booster circuit 53 is electrically connected to the control terminal 51c of the switching element 51, and also electrically connected to the load-side terminal 51b of the switching element 51 through the voltage supply load 54. That is, the structure of the reverse connection protection circuit 5 uses the booster circuit 53 for supplying the boosted voltage Vboost as the drive circuit for driving the switching element 51 and as the circuit for performing the failure detection circuit of detecting an occurrence of a switching element failure. It is accordingly possible to provide the reverse connection protection circuit 5 capable of detecting an occurrence of a switching element failure without using the electrical path opening/closing element, in addition to the switching element 51, between the power source 2 and the load drive circuit 32.

The reduction of the boosted voltage Vboost, which corresponds to the voltage at the gate terminal of the switching element 51, causes a possible problem for correctly turning the switching element 51 on, and for causing a switching element failure. However, the reverse connection protection circuit 5 having the improved structure according to the exemplary embodiment can monitor the boosted voltage Vboost. Accordingly, it is possible for the reverse connection protection circuit 5 having the improved structure to perform both the failure detection of the switching element 51 and the detection of voltage-drop abnormality regarding to the boosted voltage Vboost of the booster circuit 53.

The concept of the present invention is not limited by the structure of the reverse connection protection circuit 5 previously described. It is possible for the reverse connection protection circuit 5 to have various modifications.

A description will now be given of various modifications of the reverse connection protection circuit 5 according to the exemplary embodiments. The difference between the exemplary embodiment and the modifications will be explained. The same components between them will be referred with the same reference numbers and characters, and the explanation of the same components is omitted here for brevity.

As previously described, the load system 1 having the reverse connection protection circuit 5 according to the exemplary embodiment is an electric parking brake system mounted on a vehicle. The concept of the present invention is not limited by the exemplary embodiment. It is possible to apply the reverse connection protection circuit 5 according to the exemplary embodiment to power supply circuits for in-vehicle devices such as electric power steering devices, seat belt devices, etc. It is further possible to apply the reverse connection protection circuit 5 according to the exemplary embodiment to power supply devices mounted on various types of devices other than the vehicles.

It is possible to use a P channel MOS FET as the switching element 51 instead of using an N channel MOS FET. When the switching element 51 is composed of a P channel MOS FET, it is required to change the circuit structure shown in FIG. 1 and the operation states shown in FIG. 2. It is also possible to use another type of a transistor instead of using such a MOS FET. It is also acceptable to use, as the switching element 51, a circuit element other than such a transistor.

The booster circuit 53 and the judgment part 57 are formed on a single integrated circuit. It is also possible to form the booster circuit 53 in the load drive circuit 32. That is, the load drive circuit 32 supplies the boosted voltage Vboost to the switching element 51. It is also acceptable to use a voltage supply circuit for supplying the boosted voltage Vboost, which is different from the load drive circuit 32 or the boosted circuit 53.

For example, it is acceptable to use a resistance element as the voltage supply load 54. This makes it possible to provide a simple circuit structure of the reverse connection protection circuit 5. It is also possible to use another element as the voltage supply load 54 instead of using such a resistance element. The concept of the present invention is not limited by using a pull-up circuit or a circuit element configured to boost the downstream-side voltage VD to the boosted voltage Vboost when the switching element 51 is turned off.

For example, it is possible to use, as the voltage supply load 54, a load circuit such as a current power source, a constant voltage power source, etc. In a case in which such a load circuit is used as the voltage supply load 54, the pull-up voltage of the downstream-side voltage VD is higher thahn the battery voltage Vbatt, but lower than the boosted voltage Vboost supplied from the booster circuit 53. This case also makes it possible to have the same action and effects of the reverse connection protection circuit 5 having the structure according to the exemplary embodiment previously described.

The control circuit 4 and the judgment part 57 are formed on a single integrated circuit. It is also acceptable to form the control circuit 4, the voltage detection part 56 and the judgment part 57 on different integrated circuits, respectively, It is acceptable to add an additional voltage detection part which is electrically connected to the power source-side terminal 51a of the switching element 51 in addition to the voltage detection part 56 which is electrically connected to the load-side terminal 51b of the switching element 51. The additional voltage detection part generates a voltage which corresponds to an upstream-side voltage at the power source-side terminal 51a of the switching element 51. It is acceptable for the judgment part 57 to detect an occurrence of abnormality of the reverse connection protection circuit 5 on the basis of the downstream-side voltage VD detected by the voltage detection part 56 and the upstream-side voltage detected by the additional voltage detection part.

A description will be given of a first modification of the reverse connection protection circuit according to the exemplary embodiment with reference to FIG. 5.

Figure 3:
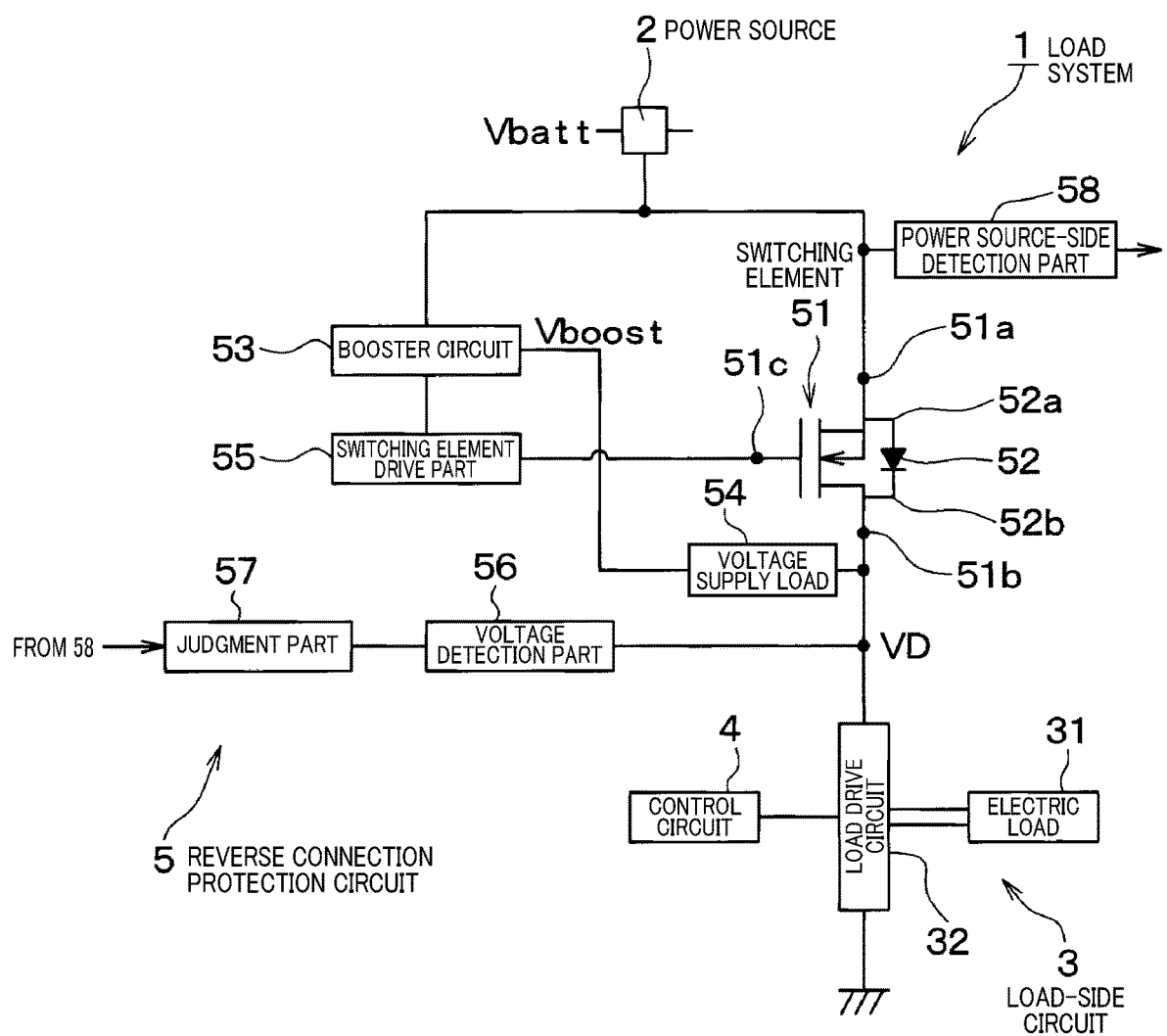
FIG. 3 is a view showing a first modification of the structure of the reverse connection protection circuit according to the exemplary embodiment of the present invention.

FIG. 3 is a view showing the first modification of the structure of the reverse connection protection circuit 5 according to the exemplary embodiment of the present invention. As shown in FIG. 3, a power source-side detection part 58 as the additional voltage detection part, previously explained, is electrically connected to the power supply path between the power source 2 and the power source-side terminal 51*a* of the switching element 51. Further, the power source-side detection part 58 is electrically connected to the judgment part 57 so as to supply a detected voltage value to the judgment part 57.

In the structure of the reverse connection protection circuit shown in FIG. 3, the judgment part 57 detects an occurrence of abnormality of the switching element 51 and the booster circuit 53 on the basis of the detection results of the voltage detection part 56 and the power source-side detection part 58. Specifically, the judgment part 57 performs the abnormality detection on the basis of a voltage difference $\Delta V$ between the upstream-side voltage VU detected by the power source-side detection part 58 and the downstream-side voltage VD detected by the voltage detection part 56.

That is, the voltage difference $\Delta V$ becomes not less than a threshold voltage $\Delta Vth$ when the switching element 51 is normally operating, the switching element 51 is turned off, and the control terminal 51*c* of the switching element 51 receives no turned-on voltage, where $\Delta V = VU - VD$.

Further, the voltage difference $\Delta V$ becomes less than the threshold voltage $\Delta Vth$ when the switching element 51 is normally operating, the switching element 51 is turned on and the control terminal 51*c* of the switching element 51 receives the turned-on voltage.

On the other hand, in a case in which the switching element 51 is in an open-circuit failure, the voltage difference $\Delta V$ becomes not less than the threshold voltage $\Delta Vth$ even if the switching element 51 is turned on. Further, in a case in which the switching element 51 is in a short-circuit failure, the voltage difference $\Delta V$ becomes less than the threshold voltage $\Delta Vth$ even if the switching element 51 is turned off.

The structure shown in FIG. 3 is not required to adjust a failure judgment threshold value such as the threshold voltage $\Delta Vth$ when the battery voltage Vbatt varies due to an individual difference of the power source 2 by the manufacturing or a charged state of the power source 2, and the boosted voltage Vbatt varies due to the variation of the battery voltage Vbatt. Accordingly, it is possible for the reverse connection protection circuit having the structure shown in FIG. 3 to correctly perform the failure detection operation regardless of the variation of the battery voltage Vbatt.

A description will be given of a second modification of the reverse connection protection circuit according to the exemplary embodiment with reference to FIG. 4.

Figure 4:
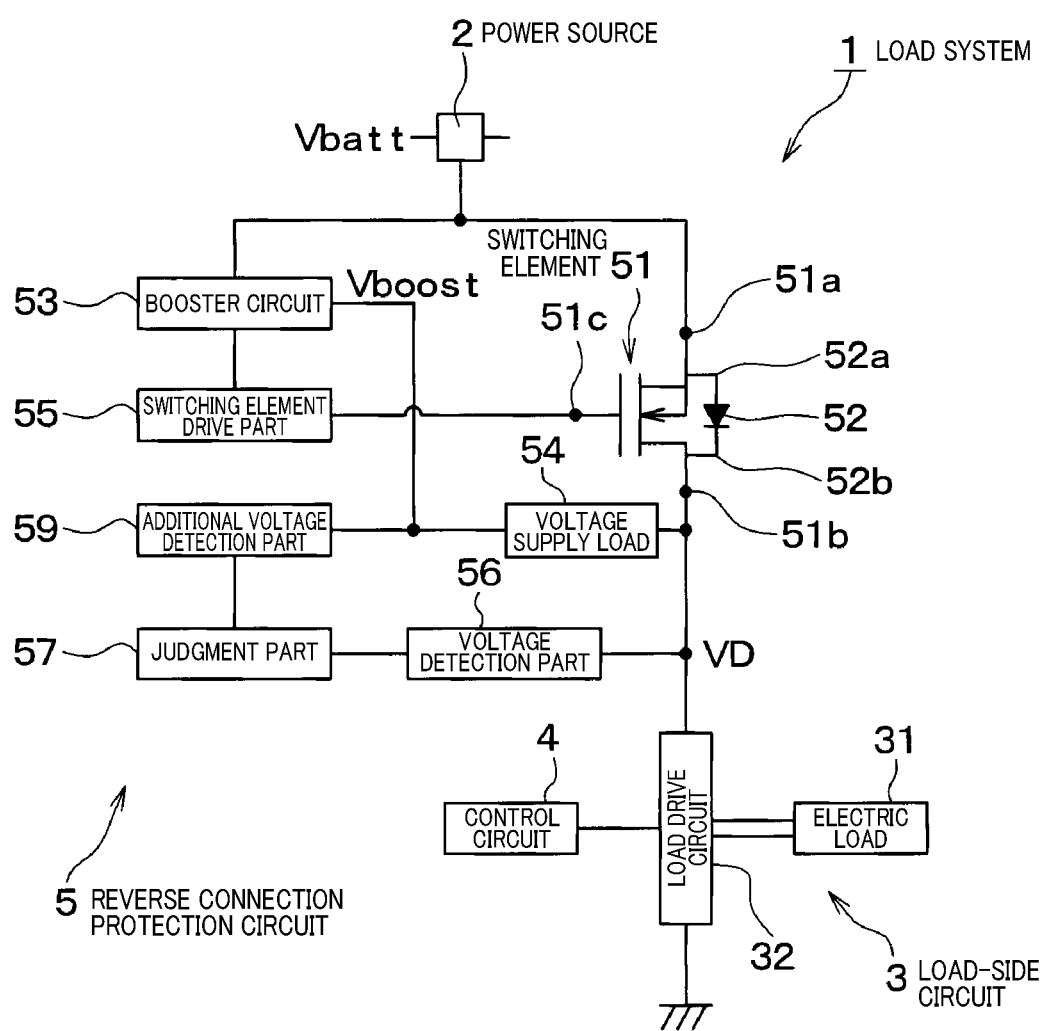
FIG. 4 is a view showing a second modification of the structure of the reverse connection protection circuit according to the exemplary embodiment of the present invention.

FIG. 4 is a view showing the second modification of the structure of the reverse connection protection circuit according to the exemplary embodiment of the present invention. As shown in FIG. 4, it is acceptable to add an additional voltage detection part 59 into the structure of the reverse connection protection circuit 5 shown in FIG. 1. The additional voltage detection part 59 is capable of detecting the boosted voltage Vboost of the booster circuit 53. That is, in order to supply the voltage which corresponds to the boosted voltage Vboost of the booster circuit 53, the additional voltage detection part 59 is arranged at the output side of the booster circuit 53, i.e. arranged between the booster circuit 53 and the voltage supply load 54.

It is also acceptable to add the power source-side detection part 58 shown in FIG. 3 into the structure shown in FIG. 4.

The structure shown in FIG. 4 allows the judgment section 57 to detect an occurrence of abnormality regarding to the boosted voltage Vboost of the booster circuit 53 on the basis of an output voltage VB (hereinafter, referred to as the detected booster output voltage VB) of the booster circuit 53 detected by the additional voltage detection part 59. Specifically, the judgment section 57 detects the occurrence of abnormality of the boosted voltage Vboost on the basis of a comparison whether the detected booster output voltage VB is higher than the boosted voltage Vbatt by a predetermined voltage. The structure shown in FIG. 4 correctly detects whether the boosted voltage Vboost is in abnormality, i.e. detects an occurrence of abnormality of the boosted circuit 53.

A description will be given of a third modification of the reverse connection protection circuit according to the exemplary embodiment with reference to FIG. 5.

Figure 5:
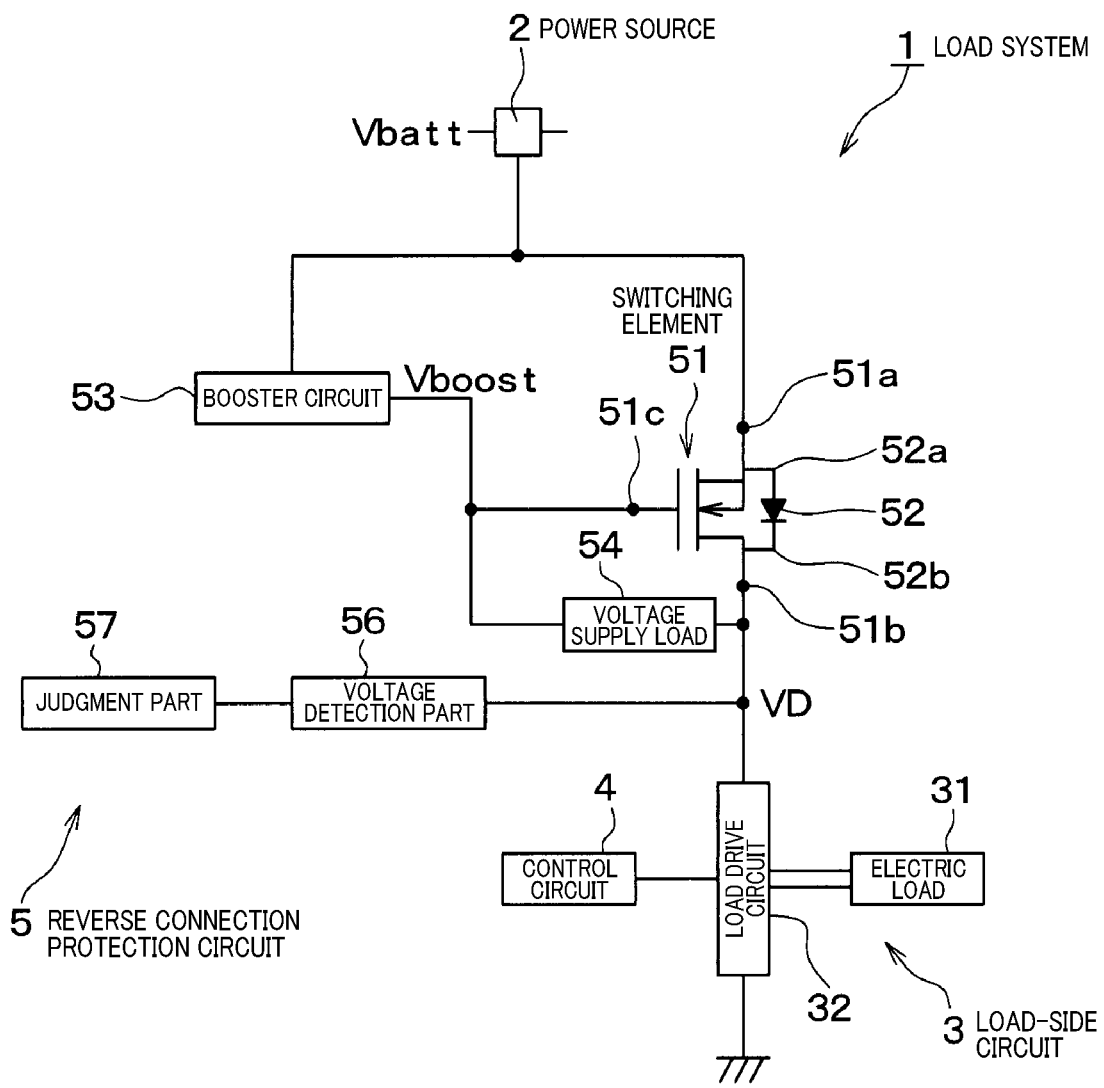
FIG. 5 is a view showing a third modification of the structure of the reverse connection protection circuit according to the exemplary embodiment of the present invention.

FIG. 5 is a view showing the third modification of the structure of the reverse connection protection circuit according to the exemplary embodiment of the present invention. As shown in FIG. 5, the switching element drive part 55 shown in FIG. 1 is eliminated from the structure of the reverse connection protection circuit 5 shown in FIG. 5. In addition, it is possible to electrically connect the output-side terminal of the booster circuit 53 to the control terminal 51*c* of the switching element 51. That is, the booster circuit 53 is electrically connected to the control terminal 51*c* of the switching element 51 so as to supply the boosted voltage Vboost to the control terminal 51*c* of the switching element 51. In this structure, it is acceptable to add a gate resistance between the output-side terminal of the booster circuit 53 and the control terminal 51*c* of the switching element 51. It is also acceptable to eliminate the gate resistance from the structure shown in FIG. 5.

In the structure of the reverse connection protection circuit 5 shown in FIG. 5, the control terminal 51*c* of the switching element 51 always receives the boosted voltage Vboost supplied from the booster circuit 53 when the power source 2 supplies electric power to the load system 1. When the switching element 51 is correctly operating, the downstream-side voltage VD becomes equal to the battery voltage Vbatt. On the other hand, when an opening circuit failure occurs in the switching element 51, the downstream-side voltage VD becomes the boosted voltage Vboost which is higher than the battery voltage Vbatt. Accordingly, the judgment section 57 detects the downstream-side voltage VD which corresponds to the output voltage of the voltage detection part 56, and detects an occurrence of the opening circuit failure of the switching element 51 on the basis of the detected downstream-side voltage VD.

Because the switching element drive part 55 is eliminated from the structure of the reverse connection protection circuit 5 shown in FIG. 5, it is possible to reduce a circuit area of the reverse connection protection circuit 5. Further, the structure shown in FIG. 5 makes it possible to use an additional power source, for example, an external power source circuit, as the power source to supply a necessary voltage to the booster circuit 53. The additional power source is different from the booster circuit 53 capable of driving the switching element 51 at a high-voltage.

A description will be given of a fourth modification of the reverse connection protection circuit according to the exemplary embodiment with reference to FIG. 6.

Figure 6:
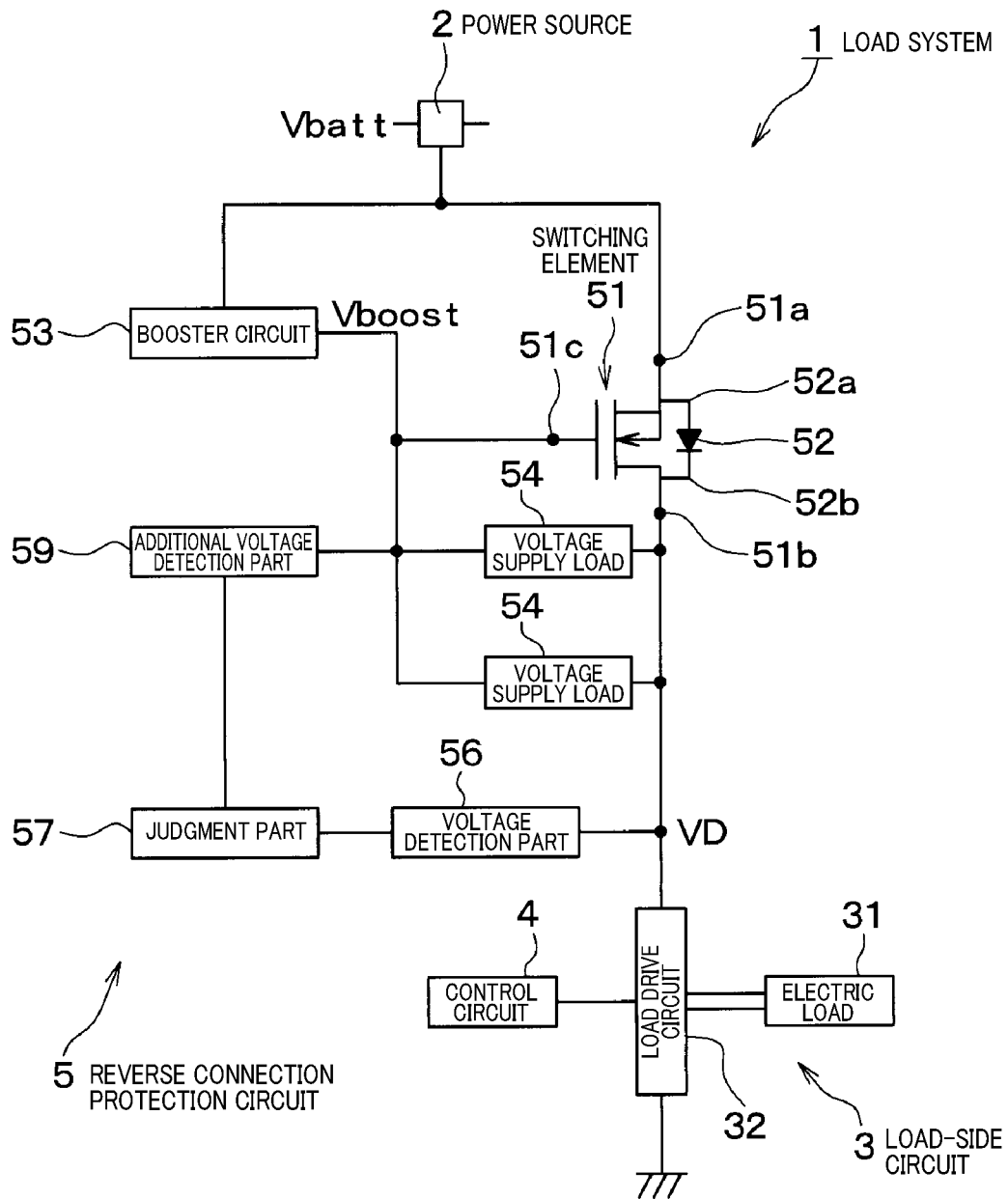
FIG. 6 is a view showing a fourth modification of the structure of the reverse connection protection circuit according to the exemplary embodiment of the present invention.

FIG. 6 is a view showing the fourth modification of the structure of the reverse connection protection circuit according to the exemplary embodiment of the present invention.

The reverse connection protection circuit 5 shown in FIG. 6 uses an additional voltage detection part 59 arranged at the booster circuit-side.

In the circuit structure shown in FIG. 5, there is a possible case in which a failure occurs in the booster circuit 53 or the voltage supply load 54. Such a failure will be referred to as the booster voltage supply failure.

When the booster voltage supply failure occurs, it is difficult to supply the boosted voltage Vboost to the load-side terminal 51b of the switching element 51, and difficult to correctly detect an occurrence of the open-circuit failure of the switching element 51.

In order to avoid such a problem, the reverse connection protection circuit 5 having the additional voltage detection part 59 shown in FIG. 6 correctly detects the occurrence of the booster voltage supply failure.

In the circuit structure of the reverse connection protection circuit 5 shown in FIG. 6, when the switching element 51 is correctly operating, the downstream-side voltage VD becomes equal to the boosted voltage Vboost and the detected booster output voltage VB provided from the additional voltage detection part 59 becomes the boosted voltage Vboost.

On the other hand, when an open-circuit failure occurs in the switching element 51, both the downstream-side voltage VD and the detected booster output voltage VB become equal to the boosted voltage Vboost.

When the booster voltage supply failure occurs, the downstream-side voltage VD becomes substantially equal to the battery voltage Vbatt, and the detected booster output voltage VB provided from the additional voltage detection part 59 does not equal to the boosted voltage Vboost, i.e. is lower than the boosted voltage Vboost by a predetermined voltage. Accordingly, the structure of the reverse connection protection circuit 5 shown in FIG. 6 makes it possible to correctly detect the open-circuit failure on the basis of the downstream-side voltage VD and to detect the booster voltage supply failure on the basis of the detected booster output voltage VB.

Still further, as shown in FIG. 6, it is possible to arrange a plurality of the voltage supply loads 54 in parallel. When one of the voltage supply loads 54 is not correctly operating, the structure shown in FIG. 6 makes it possible to use other voltage supply loads 54 which are correctly operating, and to correctly perform the failure detection.

It is also acceptable for the reverse connection protection circuit 5 in the load system 1 shown in FIG. 1 to use a plurality of the voltage supply loads 54.

The failure detection operation is performed at the power-on of the load system 1, i.e. the turning-on of the ignition switch of a vehicle, for example. Further, the failure detection operation is also performed at an optional timing during the turned-on state of the load system 1. In the latter case, the failure detection operation is performed at a timing when the switching element is switched from the turned-off state to the turned-on state, or at a timing when the switching element is switched from the turned-on state to the turned-off state.

It is acceptable to stop the electric load 31 operating immediately when the failure detection operation detects the failure of the switching element 51 or the failure of the booster circuit 53. It is acceptable to retry the failure detection operation a predetermined number of times.

A description will be given of a fifth modification of the reverse connection protection circuit according to the exemplary embodiment with reference to FIG. 7.

Figure 7:
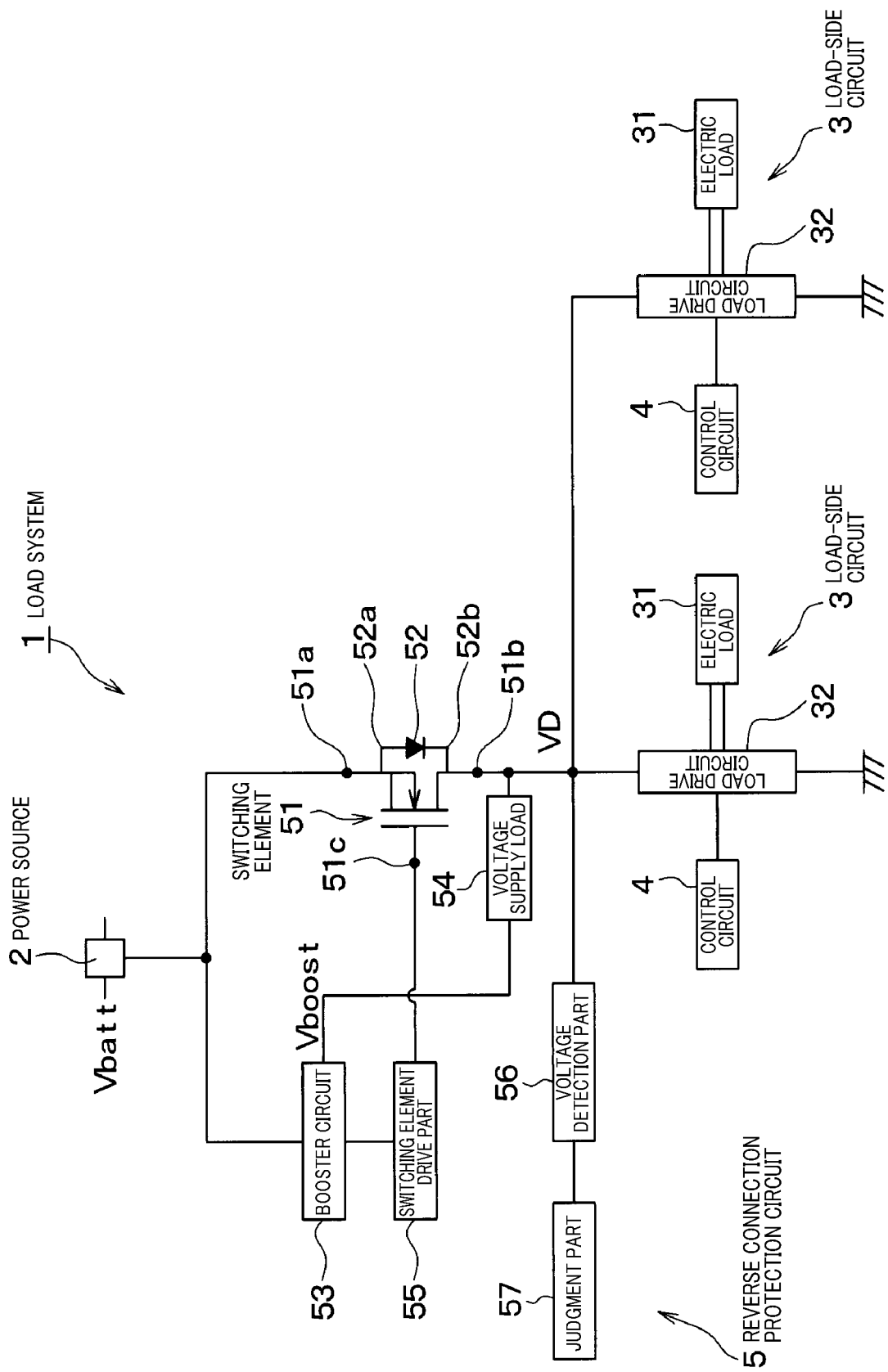
FIG. 7 is a view showing a fifth modification of the structure of the reverse connection protection circuit according to the exemplary embodiment of the present invention.

FIG. 7 is a view showing the fifth modification of the structure of the reverse connection protection circuit according to the exemplary embodiment of the present invention. In the structure shown in FIG. 7, a plurality of the load-side circuits 3 are arranged. That is, the reverse connection protection circuit 5 is arranged between the power source 2 and the plurality of the load-side circuits 3. As shown in FIG. 7, the load-side circuits 3 are electrically connected in parallel to the load-side terminal 51b of the switching element 51. It is acceptable to connect not less than three load-side circuits 3 instead of using the two load-side circuits 3 shown in FIG. 7.

In the structure shown in FIG. 7, it is acceptable to use one of the load-side circuits 3 as the electric parking brake system, and the other as an electronic stability control (ESC) system. These two load-side circuits 3 are not driven simultaneously.

Because the two load-side circuits 3 are not driven simultaneously in the structure shown in FIG. 7, this makes it possible to avoid the circuit size of the reverse connection protection circuit 5 and the load-side circuits 3 from increasing. Specifically, the reverse connection protection circuit 5 is applied to the electric parking brake system as one of the load-side circuits 3 which uses a large load current. This structure makes it possible to correctly use the reverse connection protection circuit 5 for the two load-side circuits 3.

It is possible to provide the reverse connection protection circuit 5 in a load system composed of not less than three load-side circuits 3. In this structure, the reverse connection protection circuit 5 is applied to one of the load-side circuits 3, which uses a maximum load current.

In the structure of each of the structures shown in FIG. 3 to FIG. 6, the reverse connection protection circuit 5 is arranged in parallel to a plurality of the load-side circuits 3.

It is possible to combine a part or overall of the structures according to the exemplary embodiment and the various modifications thereof.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A reverse connection protection circuit configured to protect a load-side circuit during a reverse connection of a power source to a load-side circuit, the load-side circuit comprising an electric load and a load drive circuit, the reverse connection protection circuit comprising:

a switching element comprising a power source-side terminal electrically connected to the power source, a load-side terminal electrically connected to the load drive circuit, and a control terminal by which conduction between the power source-side terminal and the load-side terminal of the switching element is controlled;

a protection element configured to enter a conductive state when the power source is electrically connected in a forward direction to the load-side circuit, and to enter a non-conductive state when the power source is electrically connected in a reverse direction to the load-side circuit, the protection element comprising a first terminal and a second terminal, the first terminal being electrically connected to the power source-side terminal of the switching element, and the second terminal being electrically connected to the load-side terminal of the switching element;

a boosted voltage supply part electrically connected to the load-side terminal of the switching element so as to supply a boosted voltage to the load-side terminal of the switching element, the boosted voltage being higher than a power source voltage supplied from the power source;

a voltage detection part electrically connected to the load-side terminal of the switching element so as to detect an output voltage at the load-side terminal of the switching element; and a judgment part electrically connected to the voltage detection part so as to detect an occurrence of a switching element failure on the basis of the output voltage detected by the voltage detection part.

2. The reverse connection protection circuit according to claim 1, further comprising a switching element drive part electrically connected to the boosted voltage supply part and the control terminal of the switching element, and configured to conduct the power source-side terminal with the load-side terminal of the switching element when supplying a turned-on voltage to the control terminal of the switching element,
wherein the boosted voltage supply part is configured to boost the power source voltage to the boosted voltage and supply the boosted voltage to the switching element drive part.

3. The reverse connection protection circuit according to claim 1, wherein the boosted voltage supply part is electrically connected to the control terminal of the switching element so as to supply the boosted voltage to the control terminal of the switching element.

4. The reverse connection protection circuit according to claim 1, wherein the switching element is composed of a MOS FET, and the protection element is composed of a parasitic diode of the MOS FET.

5. The reverse connection protection circuit according to claim 2, wherein the switching element is composed of a MOS FET, and the protection element is composed of a parasitic diode of the MOS FET.

6. The reverse connection protection circuit according to claim 3, wherein the switching element is composed of a MOS FET, and the protection element is composed of a parasitic diode of the MOS FET.

7. The reverse connection protection circuit according to claim 4, wherein the switching element is composed of an N channel MOS FET.

8. The reverse connection protection circuit according to claim 5, wherein the switching element is composed of an N channel MOS FET.

9. The reverse connection protection circuit according to claim 6, wherein the switching element is composed of an N channel MOS FET.

10. The reverse connection protection circuit according to claim 1, wherein the switching element is electrically connected to a high-voltage side of the load drive circuit.

11. The reverse connection protection circuit according to claim 2, wherein the switching element is electrically connected to a high-voltage side of the load drive circuit.

12. The reverse connection protection circuit according to claim 3, wherein the switching element is electrically connected to a high-voltage side of the load drive circuit.

13. The reverse connection protection circuit according to claim 1, wherein the switching element is arranged and directly electrically connected between the power source and the load drive circuit in the load-side circuit.

14. The reverse connection protection circuit according to claim 1, wherein the judgment part detects an occurrence of failure in the switching element and an abnormality of the boosted voltage.

15. The reverse connection protection circuit according to claim 14, further comprising an additional detection part electrically connected to the boosted voltage supply part and configured to generate an output signal which corresponds to a magnitude of the boosted voltage supplied from the boosted voltage supply part,
wherein the judgment part detects the occurrence of abnormality of the boosted voltage on the basis of the output signal which corresponding to the boosted voltage of the boosted voltage supply part.

16. The reverse connection protection circuit according to claim 1, further comprising a power source-side detection part which is electrically connected to the power source-side terminal of the switching element 51 and configured to generate an output signal which corresponds to the voltage at the power source-side terminal of the switching element,
wherein the judgment part detects an occurrence of failure in the switching element on the basis of an output signal of the voltage detection part and the output signal of the power source-side detection part.

17. A load system comprising: the reverse connection protection circuit according to claim 1; and a plurality of the load-side circuits, each of which is electrically connected in parallel to each other to the reverse connection protection circuit.

18. A load system comprising:
a plurality of load-side circuits, each of which comprises a load drive circuit and an electric load, each of the load drive circuits configured to drive the corresponding electric load; and
a reverse connection protection circuit arranged between a power source and the plurality of the load-side circuits, and configured to protect the plurality of the load-side circuits during a reverse connection of the power source to the plurality of the load-side circuits,
wherein the reverse connection protection circuit comprises:
a switching element comprising a power source-side terminal electrically connected to the power source, a load-side terminal electrically connected to each of the load drive circuits, and a control terminal by which conduction between the power source-side terminal and the load-side terminal of the switching element is controlled;
a protection element configured to enter a conductive state when the power source is electrically connected in a forward direction to the load-side circuit, and to enter a non-conductive state when the power source is electrically connected in a reverse direction to the load-side circuit, the protection element comprising a first terminal and a second terminal, the first terminal being electrically connected to the power source-side terminal of the switching element, and the second terminal being electrically connected to the load-side terminal of the switching element;
a boosted voltage supply part electrically connected to the load-side terminal of the switching element so as to supply a boosted voltage to the load-side terminal of the switching element, the boosted voltage being higher than a power source voltage supplied from the power source;

a voltage detection part electrically connected to the load-side terminal of the switching element so as to detect an output voltage at the load-side terminal of the switching element; and a judgment part electrically connected to the voltage detection part so as to detect an occurrence of a switching element failure on the basis of the output voltage detected by the voltage detection part.

\* \* \* \* \*